United States Patent
Jüstel et al.

(10) Patent No.: US 10,131,839 B2
(45) Date of Patent: Nov. 20, 2018

(54) LIGHT EMITTING DEVICE

(71) Applicant: SEABOROUGH IP I B.V., Amsterdam (NL)

(72) Inventors: Thomas Jüstel, Witten (DE); Julian Plewa, Münster (DE); Stephanie Möller, Steinfurt (DE); Jürgen Honold, Amsterdam (NL)

(*) Notice: Subject to any disclaimer, the term of this patent is extended or adjusted under 35 U.S.C. 154(b) by 0 days.

(21) Appl. No.: 15/509,860

(22) PCT Filed: Sep. 10, 2015

(86) PCT No.: PCT/EP2015/070742
§ 371 (c)(1),
(2) Date: Mar. 9, 2017

(87) PCT Pub. No.: WO2016/038149
PCT Pub. Date: Mar. 17, 2016

(65) Prior Publication Data
US 2017/0253798 A1    Sep. 7, 2017

(30) Foreign Application Priority Data
Sep. 10, 2014 (DE) .......... 10 2014 113 068

(51) Int. Cl.
*H01L 33/60* (2010.01)
*C09K 11/77* (2006.01)
*H01L 33/50* (2010.01)

(52) U.S. Cl.
CPC ........ *C09K 11/7794* (2013.01); *H01L 33/502* (2013.01); *H01L 33/60* (2013.01); *H01L 33/504* (2013.01)

(58) Field of Classification Search
CPC ... C09K 11/7794; H01L 33/502; H01L 33/60; H01L 33/504
See application file for complete search history.

(56) References Cited

U.S. PATENT DOCUMENTS

| | | | |
|---|---|---|---|
| 2004/0145307 A1* | 7/2004 | Odaki | C01G 39/006 313/512 |
| 2006/0169986 A1 | 8/2006 | Radkov et al. | |
| 2011/0182056 A1 | 7/2011 | Trottier et al. | |
| 2013/0270516 A1 | 10/2013 | D'Evelyn et al. | |
| 2014/0213001 A1 | 7/2014 | Raring et al. | |

FOREIGN PATENT DOCUMENTS

| | | |
|---|---|---|
| DE | 102007039260 A1 | 2/2009 |
| WO | WO2005078048 A1 | 8/2005 |

OTHER PUBLICATIONS

International Search Report dated Jan. 7, 2016; PCT/EP2015/070742; International Filing Date: Sep. 10, 2015; 3 pgs.

* cited by examiner

*Primary Examiner* — Kyoung Lee
(74) *Attorney, Agent, or Firm* — Hoyng Rokh Monegier LLP; David P. Owen

(57) ABSTRACT

A high-energy LED is provided, in particular based on the n-polar technique, comprising a $Eu^{3+}$ activated converter material based on tungsten/molybdenum oxide. Surprisingly, these materials do not show any saturation.

10 Claims, 4 Drawing Sheets

LIGHT EMITTING DEVICE

CROSS-REFERENCE TO RELATED APPLICATIONS

This application claims priority to PCT Application No. PCT/EP2015/070742, having a filing date of Sep. 10, 2015, based on DE 10 2014 113 068.5, having a filing date of Sep. 10, 2014, the entire contents both of which are hereby incorporated by reference.

FIELD OF TECHNOLOGY

The following relates to the field of light-emitting devices, in particular LEDs.

BACKGROUND

With respect to LEDs due to the increasing requirements it is noted in the recent years that there is a change from the classical blue LED to the so-called "GaN-on-GaN" or "n-Pola", "non-polar" or "semi-polar" technologies which are able to operate at higher current densities and to generate a significantly higher luminous efficiency/output therefrom. In order to generate visible radiation, in particular (warm) white light, moreover, corresponding converter materials are required which convert the UV-A or blue primary radiation generated by the semiconductor chip in such a way that light of the respective color can be generated.

As an alternative to the abovementioned LED technology other LED technologies are also considered which are capable of generating particularly high radiation powers by realizing higher electrical currents per mm$^2$ of light-emitting surface, such as the LED technologies referred to as "3D"-LED or Nano-LED or Nanowire-LED technologies.

Alternatively, solutions based on laser technology are taken into consideration, too, i.e. in which the UV-A or blue primary radiation is generated by means of lasers.

When a blue LED is used in combination with a yellow fluorescent material, (cold) white light can be generated whose color rendering index is comparatively low. In order to achieve a high color rendering index use of an RGB system is necessary, wherein in the case of a blue emitting semiconductor element a green and a red emitting, and in the case of a UV-A emitting semiconductor element a blue, a green or yellow and a red emitting fluorescent material are necessary.

These new techniques, in particular the n-Pola technique, are usually used with the existing converter materials, this, however, has the disadvantage that due to the mostly high saturation associated with these converter materials, in particular regarding red emitting converter materials, the advantages of the n-Pola technique cannot be optimally utilized.

SUMMARY

An aspect relates to a modified light-emitting device which is capable to overcome these disadvantages at least partly. Accordingly, a light-emitting device is proposed, comprising a semiconductor component which emits UV-A or blue primary radiation having a radiation power of ≥4 Wopt/mm$^2$ and a converter material which predominantly includes a material selected from the following list:

$A_3AE_2(Ln_{1-x-y}Eu_x)_3(MO_4)_8:RE_y$

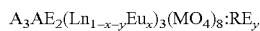

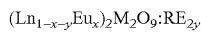

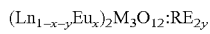

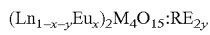

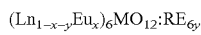

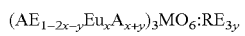

or mixtures thereof, wherein—for each structure independently—A is an alkaline earth metal, i.e. selected from the group consisting of lithium, sodium, potassium, rubidium, cesium or mixtures thereof, AE is an alkaline earth metal, i.e. selected from the group consisting of magnesium, calcium, strontium, barium or mixtures thereof, Ln is a rare earth metal selected from the group consisting of scandium, yttrium, lanthanum, gadolinium and lutetium or mixtures thereof, M is molybdenum, tungsten or mixtures thereof, and RE is a rare earth metal selected from the group consisting of terbium, dysprosium, praseodymium, neodymium or mixtures thereof, wherein 0<x≤1 and 0≤y≤0.05.

In the context of embodiments of the present invention, "predominant" means ≥90% (mol/mol), preferably 95% (mol/mol), more preferably 97% (mol/mol) and most preferably 99% (mol/mol).

In the context of embodiments of the present invention "Wopt" means the optical power ("power radiance").

Here, RE is a CO doping, wherein preferably y≥0.001 and ≤0.05, more preferably y≥0.01 and ≤0.03. Alternatively, however, structures which do not contain RE are also preferred, wherein these are also preferred embodiments of the invention, i.e. y=0.

A particularly preferred material is $A_3AE_2(Ln_{1-x-y}Eu_x)_3(MO_4)_8:RE_y$. This has been found to be particularly stable in many applications.

Surprisingly, it has been found that no or only a slight saturation occurs with the use of these Eu$^{3+}$ activated converter materials together with corresponding semiconductor components emitting UV-A or blue high-energy light, so that the efficiency of the light-emitting device is drastically increased. Herein, no or only slight saturation means in particular that the converter material saturates to less than 10% at an excitation density of 1 kW/mm$^2$.

Eu$^{3+}$ is a comparatively slow activator. The decay time $t_{1/10}$ is approximately 3 ms, i.e. 3 ms after the excitation pulse 90% of the Eu$^{3+}$ ions are in the ground state again and can undergo a new luminescence process. Thus, as expected Eu$^{3+}$ luminescent materials should encounter their capacity limits with respect to the conversion rate and exhibit a saturation behavior with increasing excitation densities, so that no further increase in the emission intensity should be observed with increasing excitation density. In the case of the Eu$^{3+}$ activated red emitters usually used in lighting technology, such as $(Y,Gd)_2O_3$:Eu$^{3+}$ or $(Y,Gd)BO_3$:Eu$^{3+}$ this is indeed the case.

However, surprisingly this saturation does not occur or occurs only very slightly in the device according to embodiments of the invention such that the excitation density obtainable by the novel semiconductor component concepts can be completely converted into photons of the desired wavelength and thus a drastic increase in the total light output can be achieved.

Moreover, in most embodiments and specific implementations the device according to embodiments of the invention offers one or more of the following advantages:

The excitation maxima of the converter materials are in the range around 400 nm as well as in the range around 460 nm and thus are optimally adapted to the emission of the n-Pola UV-A or blue emitting semiconductor components.

The molybdenum and/or tungsten containing compounds which are under protection are characterized by a particularly high absorption cross section in the UV-A and blue spectral range which is not typical for europium.

The red-emitting converter materials usually exhibit a sharp emission band mostly between 610 and 630 nm with a full width at half maximum of less than 10 nm.

The converter materials generally have $Eu^{3+}$ at a non-inversion symmetric crystallographic position so that the $^5D_0$-$^7F_2$ transitions (which are responsible for the emissions between 610 and 630 nm) are preferred over the $^5D_0$-$^7F_1$ transitions which generally would result in the emissions between 590 and 600 nm which are inconsistent with to the achievement of a high color rendering index.

The converter materials often have a low melting point below 1100° C. which greatly facilitates their use in a ceramic form.

The higher thermal load of the converter material associated with the operation under higher excitation densities can be controlled particularly well with ceramic luminescence conversion elements, since ceramic luminescence conversion elements are characterized by a higher thermal conductivity and thus an improved dissipation of the thermal energy compared to polymer based luminescence conversion elements.

According to a preferred embodiment of the invention, the device comprises a UV-A or blue primary radiation emitting semiconductor component which is operated with an electrical current (or energization or current density) of $\geq 2$ A/mm². This has proven itself in practice. Particular preferred is the operation with an electrical current (or current density or energization) of $\geq 3$ A/mm².

According to a preferred embodiment of the invention the device comprises a semiconductor component which emits UV-A or blue primary radiation with a radiation power of $\geq 6$ Wopt/mm², more preferably $\geq 8$ Wopt/mm², and particularly preferably $\geq 10$ Wopt/mm².

According to a preferred embodiment of the invention the UV-A or blue primary radiation emitting semiconductor component is a laser and/or is based thereon.

According to a preferred embodiment of the invention the UV-A or blue primary radiation emitting semiconductor component is designed on or based on the n-Pola technology.

In the context of embodiments of the present invention the term "n-Pola technology" or the synonymous usable terms "GaN-on-GaN technology", non-polar or "semi-polar" technology means and/or encompasses in particular a light-emitting semiconductor component which due to a significantly reduced defect density (GaN-on-Sapphire: $5 \times 10^8$ cm$^{-2}$; GaN-On-GaN: $1 \times 10^4$ to $1 \times 10^6$ cm$^{-2}$) compared to conventional light-emitting diodes based on GaN-on-Sapphire technologies (or "GaN-on-Siliconcarbide" or "GaN-on-Silicon") enables significantly higher current densities without the droop effect known from conventional LEDs. In particular, these include semiconductor components which are produced according to Schmidt et al. Japanese Journal of Applied Physics, 2007, vol. 46, No. 7, L126-128 and/or Hashimoto et al. Nature Materials, 2007, 568-571 and/or corresponding analogous techniques.

While the external quantum yield of conventional light-emitting semiconductor components with the GaN-on-Sapphire technology is rapidly decreasing at high current densities, the external quantum yield of GaN-on GaN semiconductor components remains nearly constant at values around 90%, which means that the increase in the current density results in a nearly proportional increase of the light output and thus allows significantly higher brightnesses with the same component size.

The n-Pola technology, moreover, irrespectively of the Wopt value is of independent inventive significance.

Accordingly, in order to achieve the above object a light-emitting device is provided comprising a UV-A or blue primary radiation emitting semiconductor component according to the n-Pola technology and a converter material predominantly comprising a material selected from the following list:

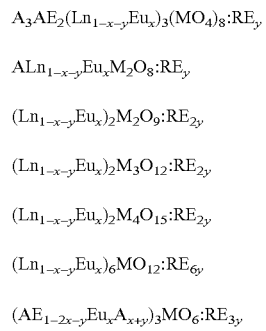

and/or mixtures thereof. All implementations described above and described in the following can also be applied mutatis mutandis to this device.

According to a preferred embodiment of the present invention the converter material is provided in powder form.

According to a preferred embodiment of the present invention the converter material is provided as a ceramic material.

In the context of embodiments of the present invention the term "ceramic material" means and/or encompasses in particular a compact crystalline or polycrystalline material which includes a controlled amount of pores or is pore-free.

In the context of embodiments of the present invention the term "polycrystalline material" means and/or encompasses in particular a material with a volume density of more than 90 percent of the main component consisting of more than 80 percent of individual crystal domains, wherein each crystal domain has a diameter of 0.1-1.0 μm and deviating crystallographic orientation. The individual crystal domains can be connected or diluted via amorphous or vitreous material or via additional crystalline components.

According to a preferred embodiment of the present invention the crystalline material has a density of $\geq 90\%$ to $\leq 100\%$ of the theoretical density. This has been proved to be advantageous for many applications of embodiments of the present invention.

According to a preferred embodiment of the present invention the light-emitting device additionally comprises a green emitting material.

In the context of embodiments of the present invention the term "green emitting" means a material which at suitable excitation has an emission band between 500 nm and 550 nm.

The following structures are particularly preferred for the green emitting material: $BaMgAl_{10}O_{17}:Eu^{2+},Mn^{2+}$, $(Sr_{1-x}Ba_x)Si_2N_2O_2:Eu^{2+}$, $(Sr_{1-x}Ba_x)_2SiO_4:Eu^{2+}$, $(Sr_{1-x}Ba_x)_3SiO_5:Eu^{2+}$, $(Sr_{1-x}Ba_x)Ga_2S_4:Eu^{2+}$, $(Lu_{1-x}Y_x)_3(Al_{1-y}Ga_y)_5O_{12}:Ce^{3+}$, $(Lu_{1-x}Y_x)_3(Al_{1-y}Sc_y)_5O_{12}:Ce^{3+}$ and/or mixtures of these materials.

Particular preferred are green emitting materials selected from the group consisting of $BaMgAl_{10}O_{17}:Eu^{2+},Mn^{2+}$, $(Sr_{1-x}Ba_x)Si_2N_2O_2:Eu$, $(Sr_{1-x}Ba_x)_2SiO_4:Eu$, $(Lu_{1-x}Y_x)_3(Al_{1-y}Ga_y)_5O_{12}:Ce$, $(Lu_{1-x}Y_x)_3(Al_{1-y}Sc_y)_5O_{12}:Ce$ and/or mixtures of these materials.

According to a preferred embodiment of the present invention the light-emitting device additionally comprises a yellow emitting material.

In the context of the present invention the term "yellow emitting" means a material which at suitable excitation has an emission band between 550 and 590 nm.

The following structures are particularly preferred: $Ba_2Si_5N_8:Eu^{2+}$, $(Ca_{1-x}Sr_x)Si_2N_2O_2:Eu^{2+}$, $(Y_{1-x}Gd_x)_3(Al_{1-y}Ga_y)_5O_{12}:Ce^{3+}$, $(Y_{1-x}Tb_x)_3(Al_{1-y}Ga_y)_5O_{12}:Ce^{3+}$, $SrLi_2SiO_4:Eu^{2+}$, $(Ca_{1-x}Sr_x)_2SiO_4:Eu^{2+}$, $(Ca_{1-x}Sr_x)_3SiO_5:Eu^{2+}$ and/or mixtures of these materials.

Particularly preferred are yellow emitting materials selected from the group consisting of $Ba_2Si_5N_8:Eu^{2+}$, $(Ca_{1-x}Sr_x)Si_2N_2O_2:Eu^{2+}$, $(Y_{1-x}Gd_x)_3(Al_{1-y}Ga_y)_5O_{12}:Ce^{3+}$, $(Y_{1-x}Tb_x)_3(Al_{1-y}Ga_y)_5O_{12}:Ce^{3+}$ and/or mixtures of these materials.

According to a preferred embodiment of the present invention the light-emitting device additionally comprises a blue emitting material.

In the context of embodiments of the present invention the term "blue emitting" means a material which at suitable excitation has an emission band between 420 and 500 nm.

The following structures are particularly preferred: $(Ba_{1-x}Sr_x)MgAl_{10}O_{17}:Eu^{2+}$, $(Ba_{1-x}Sr_x)Mg_3Al_{14}O_{25}:Eu^{2+}$, $(Sr,Ca,Mg)_2Si_2O_6:Eu^{2+}$, $CaAl_2O_4:Eu^{2+}$, $(Ba_{1-x}Sr_x)Al_2Si_2O_8:Eu^{2+}$, $(Ba_{1-x}Sr_x)_6BP_5O_{20}:Eu^{2+}$, $(Ca_{1-x-y}Sr_xBa_y)_5(PO_4)_3(F_{1-a}Cl_y):Eu^{2+}$, $(Y,Gd)(Nb_{1-x}Ta_x)O_4$ and/or mixtures of these materials.

Particular preferred are blue emitting materials selected from the group consisting of $(Ba_{1-x}Sr_x)MgAl_{10}O_{17}:Eu^{2+}$, $(Ba_{1-x}Sr_x)Mg_3Al_{14}O_{25}:Eu^{2+}$, $(Ca_{1-x-y}Sr_xBa_y)_5(PO_4)_3(F_{1-a}Cl_y):Eu^{2+}$ and/or mixtures of these materials.

The device according to embodiments of the invention can be used in a variety of concrete topological constructions or applications, including, but not limited thereto, the following:

1. "Chip Coating": The LED-Dice is coated with the fluorescent powder, then dice and fluorescent material are coated with a transparent medium (polymer or recently even glass).
2. "Fluorescent powder in a polymer or glass matrix": The fluorescent powder is mixed as homogeneously as possible with glass or a transparent polymer and applied onto the dice.
3. Combination of "chip coating" and "fluorescent powder in a polymer or glass matrix".
4. "Directly applied fluorescent ceramics": The fluorescent ceramic is applied directly as a thin platelet onto the LED dice, i.e. basically similar to "chip-coating", but in ceramic form.
5. "Remote phosphor in transmission application": The fluorescent ceramic is placed on a reflection chamber in which the LED or the laser is located. The light can only escape through the ceramic (transmission).
6. "Remote phosphor in re-emission application": The fluorescent ceramic is applied onto a reflective carrier (or is coated with a reflective material on the rear side). The LED light source or the laser is located in or slightly laterally from the radiation direction and radiates onto the remote phosphor ceramic. The converted light is re-emitted in the direction of the light source or in the radiation direction, and the light (transmission) passed through the ceramic is directed back to the radiation direction by the rear-side reflection layer. Thus, the light can only escape in the re-emission direction.

Of course, it is obvious to the person skilled in the art that modifications and combinations of the abovementioned constructions can also be used.

The components to be used according to embodiments of the invention mentioned above and claimed and described in the exemplary embodiments are not subject to any particular exceptions with respect to their size, shape, material selection and technical conception, such that the selection criteria known in the field of application can be applied without any restriction.

BRIEF DESCRIPTION

Some of the embodiments will be described in detail, with reference to the following figures, wherein like designations denote like members, wherein.

DETAILED DESCRIPTION

Figure 1:
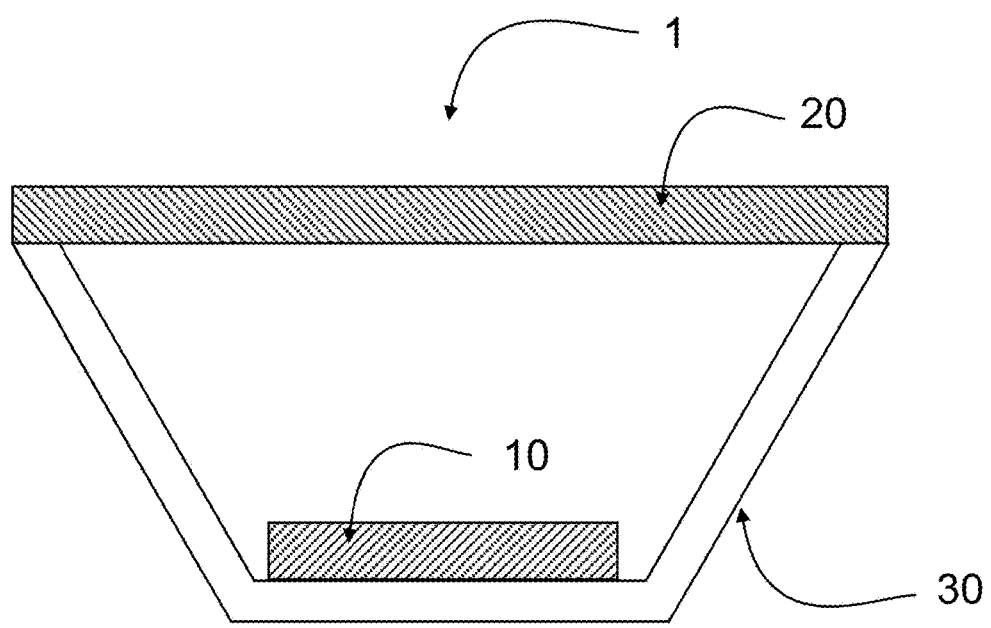
FIG. 1 is a very schematic cross-section through a first embodiment of a device according to embodiments of the invention.

FIG. 1 shows a first embodiment of the device according to embodiments of the invention in the sense of a "remote phosphor" application. However, this is not restrictive and it is self-evident to a person skilled in the art that other embodiments are also conceivable. According to FIG. 1 the device 1 comprises a UV-A or blue emitting semiconductor component 10 which is e.g. based on the n-Pola technology (GaN-on-GaN technology). Alternatively, the semiconductor component may be a laser or be implemented according to other LED technologies which achieve a higher radiation power per $mm^2$ by enabling a higher energization of the light-emitting surface.

The semiconductor component 10 is arranged in a reflective housing 30 above which the luminescence conversion element is located which includes the red emitting converter 20 and is configured as a ceramic.

The following is further presented with reference to the following example, which is purely illustrative and not restrictive.

Example I

Figure 2:
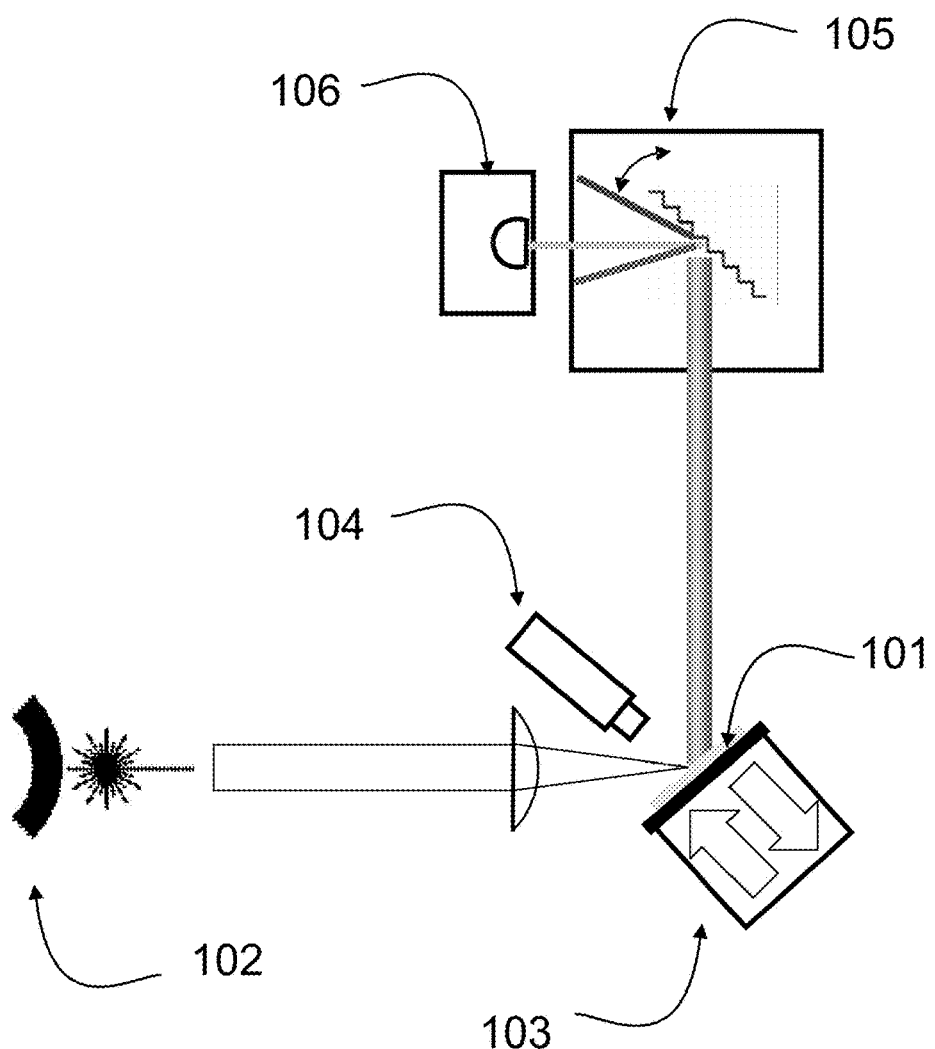
FIG. 2 is a very schematic experimental view for measuring the saturation of materials.
Figure 3:
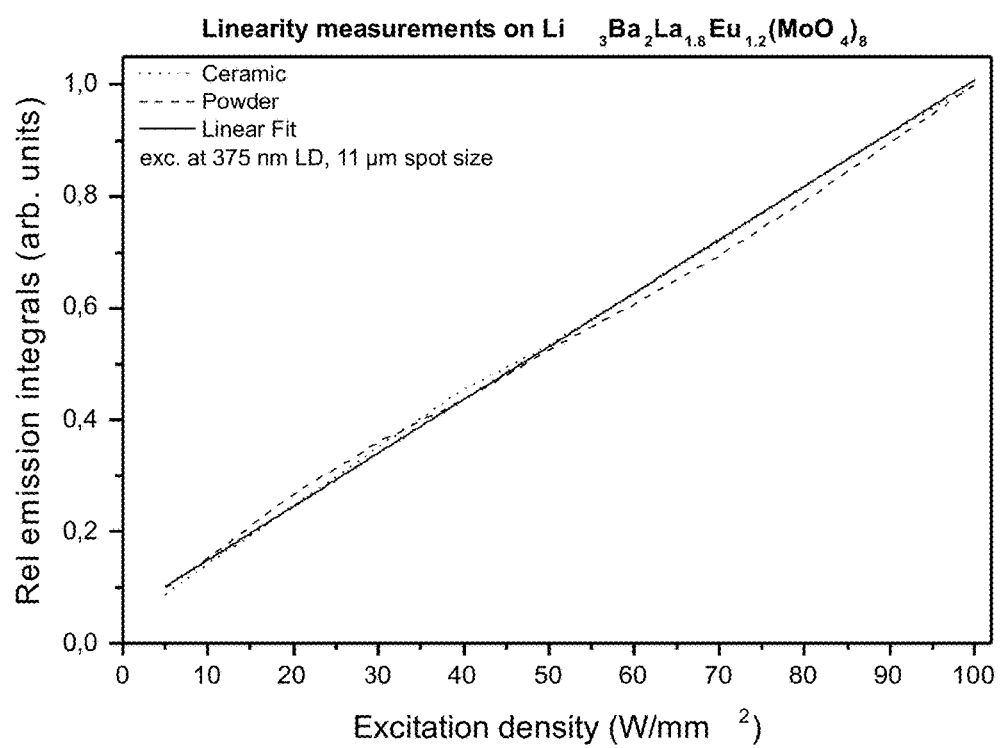
FIG. 3 is a diagram showing the integrated emission versus the excitation density of a corresponding material.
Figure 4:
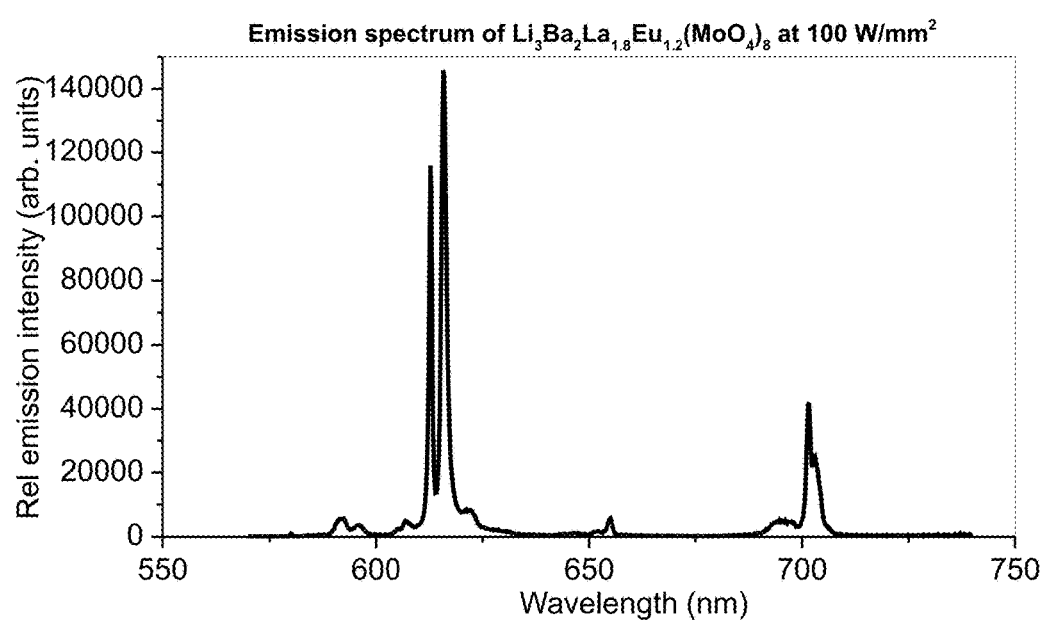
FIG. 4 is the emission spectrum of the material from FIG. 3.

FIGS. 2 to 4 refer to $Li_3Ba_2La_{1.8}Eu_{1.2}(MoO)_4$, which was prepared as follows:

Synthesis of $Li_3Ba_2La_{1.8}Eu_{1.2}(MoO_4)_8$ 0.7894 g (4.000 mmol) $BaCO_3$, 2.3030 g (16.000 mmol) $MoO_3$, 0.2217 g (3.000 mmol) $Li_2CO_3$, 0.4223 g (1.200 mmol) $Eu_2O_3$ and 0.5865 g (1.800 mmol) $La_2O_3$ were ground in a mortar with acetone as a grinding aid. The resulting powder was dried, transferred to a porcelain crucible and calcined at 800° C. for 12 h in the air. The cake thus obtained was ground and sieved through a 36 μm sieve.

FIG. 2 shows a very schematic experimental view for measuring the saturation of materials used to create the diagram of FIG. 3.

In the experimental view a sample 101 is irradiated with a laser diode 102 (OBIS Laser 375 nm LX 50 mW), the light of which is focused by a lens 103. In this case the sample 101 is cooled by the cooler 105 either passively (silver substrate) or actively (He cryostat).

Subsequently, the light after having passed through a monochromator 105 is directed onto the detector 106.

FIG. 3 shows a diagram in which the relative emission integrals are plotted versus the excitation density upon irradiation of the material according to Example I. Here, both a powder (dashed line) and a ceramic (dotted line) were measured.

It can clearly be seen in FIG. 3 that the curve extends linearly, that is, saturation does not occur or is not significant.

FIG. 4 shows the emission spectrum of the material of FIG. 1, wherein it is clearly seen that the material is red emitting.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A light emitting device comprising: a semiconductor component which emits UV-A or blue primary radiation having a radiation power of ≥4 Wopt/mm² and a converter material which predominantly includes a material selected from the following list:

$$ALn_{1-x-y}Eu_xM_2O_8:RE_y$$

$$(Ln_{1-x-y}Eu_x)_2MO_6:RE_{2y}$$

$$(Ln_{1-x-y}Eu_x)_2M_2O_9:RE_{2y}$$

$$(Ln_{1-x-y}Eu_x)_2M_4O_{12}:RE_{2y}$$

$$(Ln_{1-x-y}Eu_x)_2M_4O_{15}:RE_{2y}$$

$$(Ln_{1-x-y}Eu_x)_6MO_{12}:RE_{6y}$$

$$(AE_{1-2x-y}Eu_xA_{x+y})_3MO_6:RE_{3y}$$

$$A_3AE_2(Ln_{1-x-y}Eu_x)_3(MO_4)_8:RE_y$$

and mixtures thereof, wherein—for each structure independently—A is an alkaline earth metal selected from the group consisting of lithium, sodium, potassium, rubidium, cesium and mixtures thereof, AE is an alkaline earth metal selected from the group consisting of magnesium, calcium, strontium, barium or mixtures thereof, Ln is a rare earth metal selected from the group consisting of scandium, yttrium, lanthanum, gadolinium and lutetium and mixtures thereof, M is molybdenum, tungsten or mixtures thereof, and RE is a rare earth metal selected from the group consisting of terbium, dysprosium, praseodymium, neodymium and mixtures thereof, wherein $0<x\leq1$ and $0\leq y\leq0.05$.

2. The light-emitting device according to claim 1, wherein the energization of the UV-A or blue primary radiation emitting semiconductor component is 2 A/mm².

3. The light-emitting device according to claim 1, wherein the radiation power of the UV-A or blue primary radiation emitting semiconductor component is ≥6 W/mm².

4. The light-emitting device according to claim 1, wherein the UV-A or blue primary radiation emitting semiconductor component is based or designed on a non-Polar or semi-polar technology.

5. The light-emitting device according to claim 1, wherein the converter material is provided as a ceramic material.

6. The light-emitting device according to claim 1, further comprising a green emitting material.

7. The light-emitting device according to claim 1, further comprising a material selected from the group consisting of $BaMgAl_{10}O_{17}:Eu^{2+},Mn^{2+}$, $(Sr_{1-x}Ba_x)Si_2N_2O_2:Eu^{2+}$, $(Sr_{1-x}Ba_x)_2SiO_4:Eu^{2+}$, $(Sr_{1-x}Ba_x)_3SiO_5:Eu^{2+}$, $(Sr_{1-x}Ba_x)Ga_2S_4:Eu^{2+}$, $(Lu_{1-x}Y_x)_3(Al_{1-y}Ga_y)_5O_{12}:Ce^{3+}$, $(Lu_{1-x}Y_x)_3(Al_{1-y}Sc_y)_5O_{12}:Ce^{3+}$ and mixtures of these materials.

8. The light-emitting device according to claim 1, further comprising a yellow emitting material.

9. The light-emitting device according to claim 1, further comprising a material selected from the group consisting of $Ba_2Si_5N_8:Eu^{2+}$, $(Ca_{1-x}Sr_x)Si_2N_2O_2:Eu^{2+}$, $(Y_{1-x}Gd_x)_3(Al_{1-y}Ga_y)_5O_{12}:Ce^{3+}$, $(Y_{1-x}Tb_x)_3(Al_{1-y}Ga_y)_5O_{12}:Ce^{3+}$, $SrLi_2SiO_4:Eu^{2+}$, $(Ca_{1-x}Sr_x)_2SiO_4:Eu^{2+}$, $(Ca_{1-x}Sr_x)_3SiO_5:Eu^{2+}$, and mixtures of these materials.

10. The light-emitting device according to claim 1, further comprising a blue emitting material.

* * * * *